United States Patent

Crowe et al.

[15] 3,646,466

[45] Feb. 29, 1972

[54] TUNNEL DIODE AMPLIFIER

[72] Inventors: William J. Crowe, Berkeley Heights; Robert G. Geissler, Cranford, both of N.J.

[73] Assignee: Raytheon Company, Lexington, Mass.

[22] Filed: June 4, 1970

[21] Appl. No.: 43,494

Related U.S. Application Data

[63] Continuation-in-part of Ser. No. 717,711, Apr. 1, 1968.

[52] U.S. Cl. ...................................................330/34, 330/61

[51] Int. Cl. ...........................................................H03f 3/10

[58] Field of Search ................................330/34, 61; 333/1.1

[56] References Cited

UNITED STATES PATENTS 3,208,003 9/1965 Sterzer.................................330/34 X 3,182,203 5/1965 Miller .................................333/1.1 X

OTHER PUBLICATIONS

Shirahata et al., " Design Technique for Wide Band Tunnel Diode Amplifier." Electronics and Communications in Japan Vol. 52 B No. 6, 1969.

*Primary Examiner*—Roy Lake
*Assistant Examiner*—Lawrence J. Dahl
*Attorney*—Milton D. Bartlett, Joseph D. Pannone and Jeffrey P. Morris

[57] ABSTRACT

An apparatus for minimizing the variation of gain with bias voltage and temperature variations in a tunnel diode microwave amplifier or other tunnel diode circuit by employing two stages in which one stage is biased at a voltage higher than the peak gain bias voltage and the other stage is biased at a voltage less than the peak gain bias voltage.

15 Claims, 7 Drawing Figures

TUNNEL DIODE AMPLIFIER

This application is a continuation-in-part of application, Ser. No. 717,711, filed Apr. 1, 1968.

BACKGROUND AND SUMMARY OF THE INVENTION

A tunnel diode is an element which exhibits a negative resistance in its forward biased region. This negative resistance according to theoretical and experimental results extends well into the high microwave region. The linear portion of the current versus voltage characteristic, the negative resistance curve, can be used to construct linear RF and microwave amplifiers. Tunnel diodes made from gallium antimonide or germanium have been used to achieve stable low noise amplification at microwave frequencies.

A tunnel diode amplifier gain changes with variation of the bias voltage applied due to a variation in the tunnel diode negative resistance with the applied voltage. In prior art tunnel diode amplifiers, both stages of a two-stage amplifier are biased in the low noise region of the negative resistance curve. The low noise region of the negative resistance curve includes only those bias voltages above the minimum negative resistance, or the peak gain voltage of the diode. Since operation of prior art tunnel diode amplifiers takes place only in the portion of the negative resistance curve above minimum negative resistance, a change in the bias voltage results in a change in the negative resistance in the same direction in both tunnel diodes thereby resulting in a change in the gain. Another disadvantage of the prior art operation only in the low noise region is that the gain of the amplifier also varies with temperature.

These disadvantages of the prior art are overcome by the present invention in which the variation of gain with bias voltage or temperature variation in a two-stage tunnel diode amplifier is minimized. This invention also applies to any two-stage amplifier in which the first stage includes a tunnel diode and the second stage includes an active element whose current-voltage characteristic compensates for variation in the current-voltage characteristic of the first stage, or in other circuits such as modulators and demodulators in which stability and low noise are critical. The mode of operation employed by the present invention is especially useful in minimizing the power drain as it reduces the current required for regulation of the bias voltage of the amplifier.

The above features and advantages of the present invention are achieved by providing apparatus for minimizing the variation of gain with bias voltage and changing temperatures of a two-stage tunnel diode amplifier in which two cascaded stages are biased, one higher and one lower than the peak gain bias voltage of the tunnel diode associated with that stage. The additional noise introduced by biasing the second stage below the peak gain bias voltage is negligible in the overall system.

DESCRIPTION OF THE PREFERRED EMBODIMENTS

Understanding the present invention will be aided by consideration of the mathematical properties relating to tunnel diodes. A tunnel diode amplifier gain changes with bias voltage due to a variation in the diode negative resistance with voltage as shown in the current versus voltage characteristic of a tunnel diode illustrated in FIG. 3. The gain of a tunnel diode is determined by the equation:

$$g=\frac{(G_L+G_D)^2+B^2}{(G_L-G_D)^2+B^2} \qquad (1)$$

where $g$ is the gain, $G_D$ is the negative conductance of a tunnel diode, $G_L$ is the real part of load (or source) admittance seen by a tunnel diode, and $B$ is the imaginary part of total circuit admittance including that of the tunnel diode.

Figures 3, 4, 5, 6, 7:
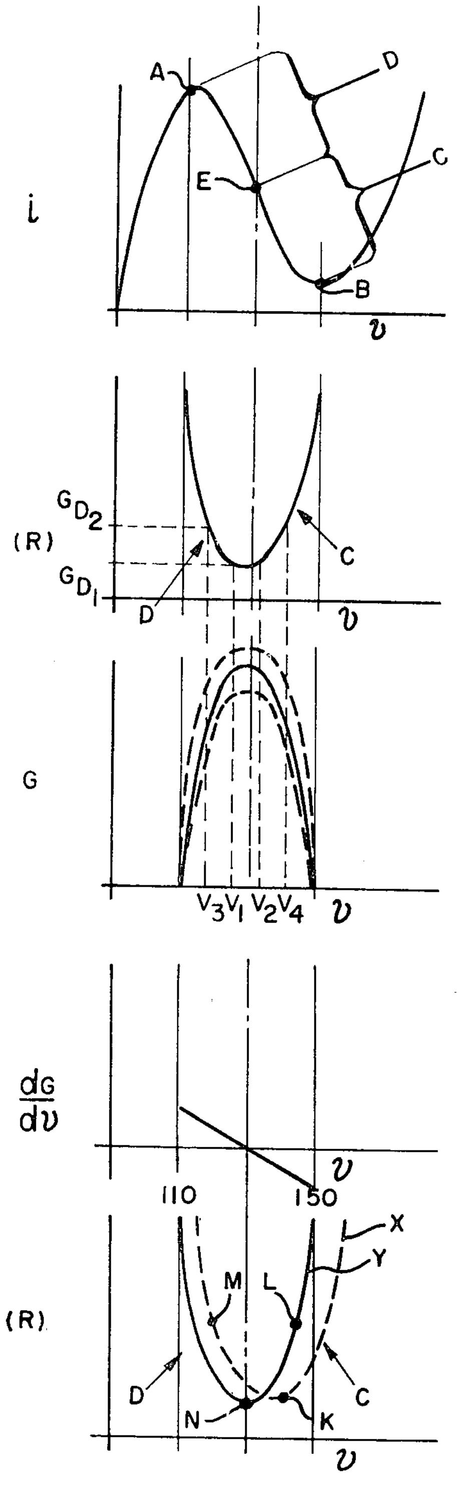
FIG. 3 is a plot of the current versus voltage characteristic of a tunnel diode.
FIG. 4 is a graph of the negative resistance of a tunnel diode versus the bias voltage.
FIG. 5 is a plot of the gain versus bias voltage for a tunnel diode.
FIG. 6 is a graph of the first derivative of the gain versus voltage for a tunnel diode having fixed gain.
FIG. 7 is a plot of the negative resistance versus bias voltage of a tunnel diode amplifier in which the temperature has changed.

The diode may be biased at $V_1$ or $V_2$ for a gain $g$ with $G_D=G_{D1}$ and $G_L=G_{L1}$, or $g$ may be maintained by biasing at $V_3$ or $V_4$ where $G_D \pm G_{D2}$. In this case, $G_L$ would be $G_{L2}$. A series of curves for gain versus bias may thus be determined for different values of $G_L$, as shown in FIG. 5. It will be noted that there is a wide selection of gain versus voltage slopes available for a specific value of gain.

The noise constant of a tunnel diode is represented by the equation:

$$k \approx i \times R_N \qquad (2)$$

where $k$ is the noise constant of the diode, $i$ is the current and $R_N$ is the negative resistance of the tunnel diode. This clearly minimizes at a diode current less than that obtained at the minimum value of $R_N$.

The total noise of a two-stage tunnel diode amplifier is determined by the equation:

$$F_T=F_1+\frac{F_2-1}{g} \qquad (3)$$

where $F_T$ is the total amplifier noise, $F_1$ is the noise of the first amplifier stage, $F_2$ is the noise of the second amplifier stage and $g$ is the overall gain of the amplifier. Since the amplifier of the present invention is a two-stage amplifier, the noise ratio of the second stage is relatively unimportant since the total noise is primarily dependent upon the first stage where there is a reasonable amount of gain. This fact can be seen from Equation 3 above.

Figure 1:
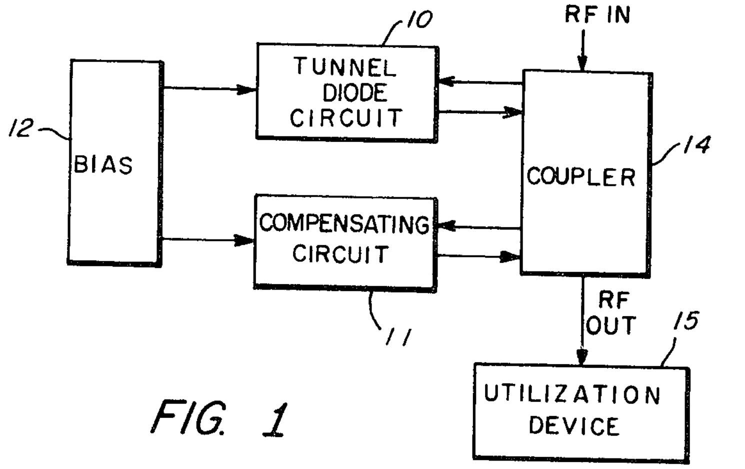
FIG. 1 is a block diagram of a two-stage tunnel diode microwave system embodying the present invention.

Referring now to FIG. 1, a tunnel diode circuit which may be a tunnel diode amplifier or other circuit such as a tunnel diode modulator or demodulator in which low noise is required is shown generally at 10 and a compensating circuit which may include either an additional tunnel diode biased in accordance with the instant invention to compensate for bias or temperature variations of circuit 10 or another compensating device other than a tunnel diode circuit is shown generally at 11. Unregulated DC bias source 12 biases circuits 10 and 11 at their operating levels. Microwave or RF signals up to 30 gigaHertz to be amplified, modulated or demodulated are fed to a suitable coupling device indicated generally at 14 which may be of the ferrite circulator type. Circulators, such as stripline, waveguide or microstrip, may effectively be utilized depending upon frequency requirements. In the present embodiment a tunnel diode amplifier is illustrated and signals to be amplified are coupled from coupler 14 to tunnel diode amplifier 10, and then coupled to a second amplifier stage 11 and back to coupler 14 where the amplified output is coupled to a utilization device 15 which may be a radar receiver, for example, where low noise and stability are required. The coupler 14 may effectively be a five-port circulator constructed from three three-port ferrite circulators of the waveguide, stripline or microstrip type. The circulator disclosed in U.S. Pat. No. 3,063,024 is exemplary of a circulator of the type which may be employed in the present invention.

Figure 2:
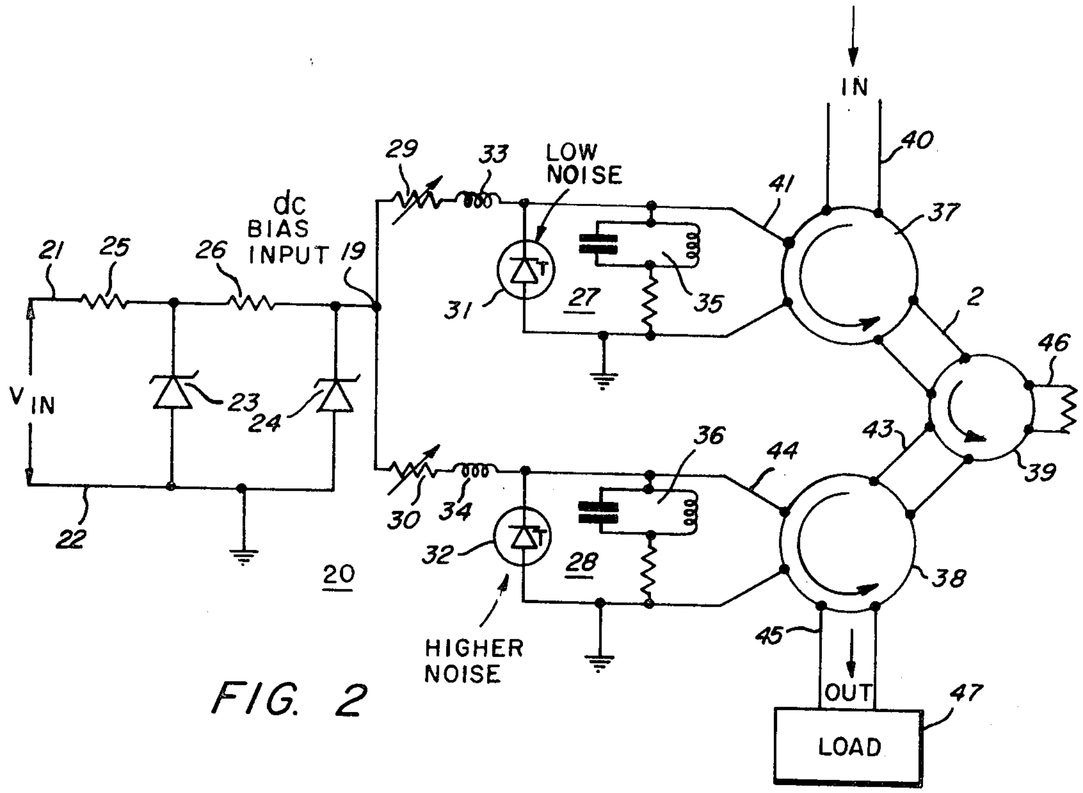
FIG. 2 is a circuit diagram of a two-stage tunnel diode amplifier embodying the present invention.

FIG. 2 shows a tunnel diode amplifier indicated generally at 20 which embodies the present invention. A source of DC input voltage is applied across input lines 21 and 22. Connected in parallel across the input are a pair of zener diodes 23 and 24 which act to regulate the input voltage before it is applied to the tunnel diodes of the amplifier. Voltage dropping resistors 25 and 26 are connected to the zener diodes 23 and 24 respectively. When the voltage at the input lines 21 and 22 changes, the zener diodes 23 and 24, having low dynamic impedance, draw more current so that most of the voltage change occurs across the dropping resistors 25 and 26. Therefore, the voltage across each of the zener diodes 23 and 24 remains relatively constant. The above-described zener diode regulating circuit provides a regulated DC input to the tunnel diode amplifier to be described. However, this regulator is used primarily as a precaution against excessive fluctuations in bias voltage since reasonable excursions will be compensated for in the tunnel diode amplifier in accordance with the present invention. Therefore, for most of the bias variations to be expected under normal operating conditions, the regulating circuitry would be unnecessary.

A pair of tunnel diode amplifier stages 27 and 28 are connected in cascaded form to a terminal 19 which is connected to the output of the regulating zener diodes 23 and 24 to which a DC bias voltage is applied. The tunnel diode amplifier stages 27 and 28 each include potentiometers 29 and 30 which are adjustable to bias tunnel diodes 31 and 32 in the low noise and higher noise operation regions, respectively. Filter chokes 33 and 34 filter any input ripple on the DC bias. Tunnel diode 31 is connected between one end of filter choke 33 and ground. An impedance loading and stabilizing circuit 35 is connected across the tunnel diode 31, and an additional impedance loading and stabilizing circuit 36 is connected across tunnel diode 32. Each of the stages 27 and 28 is connected to circulators 37 and 38, respectively, which circulators are three-port devices coupled together via an additional three-port circulator 39 to effectively form a five-port circulator.

Microwave or RF signals, for example radar signals, are coupled to circulator 37 through port 40 which is the first port of the five-port circulator formed by the three three-port circulators 37, 38 and 39. The received signal is coupled through port 41 of circulator 37, the second port of the five-port device to stage 27 of the two-stage tunnel diode amplifier and after amplification is returned through port 41 to circulator 37 with approximately 20 db. isolation from port to port to an internal connection port 42 which is the connection of the third port of three-port device 37 to the first port of the three-port device 39 where the signal is circulated and coupled through internal connection port 43 which is the connection of the second port of circulator 39 and the first port of circulator 38. The signal is then circulated in circulator 38; exits at port 44, which is the third port of the five-port device; is amplified in tunnel diode amplifier 28 and is returned through port 44 to circulator 38. The amplified output microwave signal exits at port 45 which is the fourth port of the five-port device and is isolated by 20 db. from port 44. If additional isolation is required, additional circulators may be added at port 45. Port 46, the fifth port of the five-port device, is terminated in its characteristic impedance thereby preventing undesirable reflections from load 47 from returning to the amplifier stages. Thus, the additional circulator 39 is required in order to provide the additional port necessary for the terminating impedance.

The advantages derived from the present invention will best be understood by reference to FIGS. 3 through 7. FIG. 3 shows a current versus voltage characteristic of a tunnel diode indicating a region of negative resistance between the points A and B. This region of negative resistance can further be defined into a low noise region indicated by the bracket labeled C and a higher noise region indicated by the bracket labeled D. The point E on the curve represents the point of minimum negative resistance.

FIG. 4 is a plot of the absolute variation of the negative resistance R versus the biasing voltage. This figure shows that in the higher noise region D as the bias voltage is increased, the absolute variation of the negative resistance decreases until the point of minimum negative resistance E is reached. As the bias voltage continues to increase in the low noise region C, the absolute variation of the negative resistance begins to increase.

FIG. 5 shows the effect on the total amplifier gain as bias voltage increases. The value of bias voltage which yields peak amplifier gain corresponds to the point E which represents the point of minimum negative resistance.

FIG. 6 is a plot of the first derivative of the gain versus the bias voltage for a fixed amplifier gain. This curve demonstrates the compensating advantage derived from the complementary biasing of the present invention. As stated earlier, since the noise ratio of the second amplifier stage 28 is relatively unimportant, the amplifier stage 28 may be operated in the perfectly good region referred to as the higher noise region D which occurs at bias voltages below the point of minimum negative resistance E. Therefore, by operating the amplifier stage 27 in the low noise region C and the second stage 28 in the high noise region D, advantage is taken of the fact that the change in gain versus the change in bias voltage occurs in opposite directions in the two stages. As a result, the total gain of the two-stage amplifier can be held relatively constant against variations of the total diode bias voltage.

Because of the compensating effect derived from operating the first stage 27 in the low noise region above the point of minimum negative resistance and the second stage 28 in the higher noise region below the point of minimum negative resistance, if the loading impedances 35 and 36 drift in the same direction over a period of time, this drift will be averaged out because of the mode of operation of the present invention.

In a typical example of the operation of the present invention, the input voltage Vin applied to terminals 21 and 22 may be an unregulated input of 9 volts. The voltage dropping resistors 25 and 26 are selected such that the voltage across the zener diode 23 is 6 volts and the voltage across the zener diode 24 is 3 volts. The variable resistors 29 and 30 are chosen such that a 150 millivolt (mv.) bias voltage is applied to the tunnel diode 31 and a 110 mv. bias voltage is applied to the tunnel diode 32. The variable resistor 30 has a higher resistance than the variable resistor 29 since it is desired to provide a lower bias voltage to the tunnel diode 32 than to the tunnel diode 31. When the amplifier 20 has the first tunnel diode stage 27 biased at 150 mv. and the second stage 28 biased at 110 mv. such that $$\frac{dg}{dV/V}(V=110\ mv)=\frac{dg}{dV/V}(V=150\ mv)$$

the total gain equals the sum of the gain of the two stages. The change in gain per percent change in bias voltage is thus equal and opposite for the two stages. As shown by FIG. 6 in this example, the net gain variation with voltage equals zero.

Another advantage derived from the present invention is illustrated by the graph shown in FIG. 7 in which the effect of changing temperature on the operation of the present invention is illustrated. The measured temperature characteristics indicate that the negative resistance versus bias voltage curve shifts horizontally on the horizontal axis from curve X to curve Y with only a minor change in the value of the minimum negative resistance. This result is unexpected since intuitive thinking would indicate that the curve should shift around the vertical axis whereby the point of negative resistance changes. However, as actually discovered, by changing the temperature, the point of minimum negative resistance remains the same but the curve shifts along the horizontal axis.

As shown in FIG. 6, as the temperature increases, the curve will be shifted from curve X to curve Y. When this shift occurs, the gain goes down due to the increase in negative resistance as shown at points K and L at a fixed value of bias voltage in the low noise region C. In the higher noise region D, when the temperature increases, the negative resistance goes down from point M to point N at a fixed value of bias voltage and as a result, the gain goes up. However, the balancing effect derived from biasing the first stage 27 in the low noise region C and the second stage 28 in the higher noise region D, tends to maintain relatively constant gain despite temperature changes.

The mode of operation for a two-stage tunnel diode amplifier as described by the present invention is especially useful for minimizing the power drain as it reduces the current required for regulation of the bias voltage. Where variations on the input supply voltage are present, the regulation zener diodes 23 and 24 maintain the gain stability for the tunnel diode amplifier. For variations as high as ±5 percent, an amplifier with a total gain of 36 db., for example, utilizing two stages but not employing the mode of operation of the present invention, would have a gain variation of ±6 db. Using the complementary biasing of the present invention provides an improvement of greater than two orders of magnitude in power consumption.

The complementary biasing scheme of the present invention is ideally suited not only to applications where power drain is very important as in tunnel diode amplifiers for communications satellites but also to areas where extreme stability is required such as in radio astronomy or other similar applications.

It should be understood, of course, that the foregoing disclosure relates to only a preferred embodiment of the invention and that numerous modifications or alterations may be made therein without departing from the spirit and the scope of the invention as set forth in the appended claims.

What is claimed is:

1. In combination:
- first and second tunnel diode amplifier stages connected in cascade;
- means for biasing said first tunnel diode amplifier stage at a voltage in the low noise region of said first amplifier stage said voltage being above the biasing voltage of the point of minimum negative resistance of said first tunnel diode amplifier stage; and
- means for biasing said second tunnel diode amplifier stage at a second voltage which is outside the low noise region of said second amplifier stage said second voltage being below the voltage required for biasing said second tunnel diode amplifier stage at the point of minimum negative resistance.

2. In combination:
- first and second tunnel diode amplifier stages connected in cascade;
- means for receiving a microwave input signal;
- means for coupling said microwave input signal to said first amplifier stage;
- means for biasing said first tunnel diode amplifier stage at a voltage in the low noise region of said first amplifier stage said voltage being above the voltage required for biasing said first tunnel diode amplifier stage at the point of minimum negative resistance;
- means for biasing said second tunnel diode amplifier stage at a second voltage which is outside the low noise region of said second amplifier stage said second voltage being below the voltage required for biasing said second tunnel diode amplifier stage at the point of minimum negative resistance; and
- means for deriving an output microwave signal from said second amplifier.

3. A combination in accordance with claim 2 wherein said means for receiving a microwave signal and said means for coupling said microwave signal to the first amplifier stage is a ferrite circulator.

4. A combination in accordance with claim 3 wherein said means for deriving an output signal from said second amplifier includes a ferrite circulator.

5. A combination in accordance with claim 2 wherein said means for receiving a microwave signal and said means for coupling said microwave signal to the first amplifier stage is a stripline coupler.

6. In combination:
- first and second tunnel diode amplifier stages connected in cascade;
- means for receiving a microwave input signal;
- means for coupling said microwave input signal to said first tunnel diode amplifier stage;
- means for biasing said first tunnel diode amplifier stage at a voltage above the peak gain bias voltage of said first amplifier stage such that said first tunnel diode amplifier stage is biased to operate in the low noise region;
- means for biasing said second tunnel diode amplifier stage at a voltage below the peak gain bias voltage of said second amplifier stage such that said second tunnel diode amplifier stage is biased to operate in the high noise region; and
- means for deriving an output microwave signal from said second amplifier stage.

7. A combination in accordance with claim 6 wherein said means for receiving a microwave input signal and said means for coupling said microwave signal to said first amplifier stage comprises a circulator.

8. A combination in accordance with claim 6 wherein said means for receiving a microwave input signal and for coupling said input signal to said first amplifier stage comprises a stripline coupler.

9. A combination in accordance with claim 7 wherein said means for deriving an output signal from said second amplifier stage includes a circulator.

10. In combination:
- first and second tunnel diode amplifier stages connected in cascade;
- means for receiving a microwave input signal;
- means for coupling said microwave signal to said first tunnel diode amplifier stage;
- means for biasing said first tunnel diode amplifier stage at a voltage above the bias voltage corresponding to the point of minimum negative resistance of the amplifier such that said first tunnel diode amplifier stage is biased to operate in the low noise region of said tunnel diode;
- means for biasing said second tunnel diode amplifier stage at a voltage below the bias voltage corresponding to the point of minimum negative resistance of said second tunnel diode amplifier stage such that said second tunnel diode amplifier stage is biased in the high noise region of said tunnel diode; and
- means for deriving an output signal from said second amplifier stage.

11. A combination in accordance with claim 10 wherein said means for receiving a microwave input signal and said means for coupling said microwave signal to said first amplifier state comprises a circulator.

12. A combination in accordance with claim 10 wherein said means for receiving a microwave input signal and for coupling said microwave signal to said first tunnel diode amplifier stage comprises a stripline coupler.

13. A combination in accordance with claim 11 wherein said means for deriving an output signal from said second amplifier stage includes a circulator.

14 In combination:
- first and second tunnel diode amplifier stages connected in cascade;
- means for receiving a microwave input signal;
- means for coupling said microwave signal to said first tunnel diode amplifier stage;
- bias means including an unregulated input voltage and means for regulating said unregulated input voltage to a predetermined level;
- means for applying the bias voltage developed by said bias means whereby said first tunnel diode amplifier stage is biased at a voltage above the peak gain bias voltage of said first stage such that said first tunnel diode is biased to operate in the low noise region and said second tunnel diode amplifier stage is biased at a voltage below the peak gain bias voltage of said second amplifier stage such that said second tunnel diode is biased to operate in the high noise region; and
- means for deriving an output signal from said second amplifier stage.

15. A combination in accordance with claim 14 wherein said means for receiving a microwave input signal, said means for coupling the microwave signal to said first amplifier stage, and the means for deriving an output microwave signal comprises a circulator.

* * * * *